(12) United States Patent
Henson et al.

(10) Patent No.: US 8,101,995 B2
(45) Date of Patent: Jan. 24, 2012

(54) INTEGRATED MOSFET AND SCHOTTKY DEVICE

(75) Inventors: Timothy Henson, Torrance, CA (US); Dev Alok Girdhar, Melbourne, FL (US)

(73) Assignee: International Rectifier Corporation, El Segundo, CA (US)

(\*) Notice: Subject to any disclaimer, the term of this patent is extended or adjusted under 35 U.S.C. 154(b) by 2 days.

(21) Appl. No.: 12/028,239

(22) Filed: Feb. 8, 2008

(65) Prior Publication Data

US 2008/0191274 A1 Aug. 14, 2008

Related U.S. Application Data

(60) Provisional application No. 60/900,252, filed on Feb. 8, 2007.

(51) Int. Cl.
*H01L 29/78* (2006.01)

(52) U.S. Cl. ......... 257/333; 257/288; 257/329; 257/330

(58) Field of Classification Search ............. 257/288, 257/330, 401, 901, E29, 135–136, 242, 329, 257/E27, 260; 438/292–308, 136, 137, 156, 438/173, 192, 206, 212, 257, E21
See application file for complete search history.

(56) References Cited

U.S. PATENT DOCUMENTS

| 5,612,567 A | 3/1997 | Baliga | |
|---|---|---|---|
| 5,998,833 A * | 12/1999 | Baliga | 257/329 |
| 6,621,121 B2 * | 9/2003 | Baliga | 257/330 |
| 6,710,403 B2 * | 3/2004 | Sapp | 257/330 |
| 2005/0199918 A1 * | 9/2005 | Calafut et al. | 257/260 |
| 2007/0138547 A1 * | 6/2007 | Nakamura | 257/331 |

\* cited by examiner

*Primary Examiner* — Marcos D Pizarro Crespo
*Assistant Examiner* — Sue Tang
(74) *Attorney, Agent, or Firm* — Farjami & Farjami LLP

(57) ABSTRACT

A power semiconductor device that includes a trench power MOSFET with deep source field electrodes and an integrated Schottky diode.

20 Claims, 4 Drawing Sheets

INTEGRATED MOSFET AND SCHOTTKY DEVICE

RELATED APPLICATION

This application is based on and claims priority to U.S. Provisional Application Ser. No. 60/900,252, filed on Feb. 8, 2007, entitled Deep Trench Schottky Device, to which a claim of priority is hereby made and the disclosure of which is incorporated by reference.

BACKGROUND AND SUMMARY OF THE INVENTION

US Patent application published as US Patent Publication No. 2006/0033154 and U.S. patent application Ser. No. 11/890,849 both assigned to the assignee of the present application and incorporated by reference, disclose power MOSFETs having deep source field electrodes.

Integrated Schottky diodes are available in state of the art trench MOSFETs with breakdown voltages in the range of 20-30V. These Schottky diodes take advantage of the trench structure to form a Trench MOS Barrier Schottky (TMBS) structure that provides low leakage and low Vf compared to planar Schottky diodes. Current trench technologies for devices with higher breakdown voltages (40-300) may not be suitable for an integrated TMBS type device due to higher leakage and Vf.

According to one aspect of the present invention, a high performance Schottky diode is integrated with a MOSFET having deep source field electrodes. Advantageously, the deep source field electrodes of the MOSFET allow an integrated Schottky with low reverse leakage and low Vf to be formed when the mesa width is appropriately chosen.

Simulations have shown that a Schottky diode in a device according to the present invention offers both lower leakage and Vf than a Schottky diode that could be created with a traditional trench process flow. Moreover, such a device may exhibit significantly lower Vf than a MOSFET integrated with a pn junction diode which allows a Schottky diode according to the present invention to operate at higher current levels.

According to one aspect of the present invention, in order to form an integrated Schottky in any of the previously disclosed process flows for a MOSFET with deep source field electrodes, two additional masks and a barrier metal process are employed. The first mask blocks the channel implant from the Schottky region of the device, and the second mask blocks the high conductivity contact region implant from the Schottky region.

Other features and advantages of the present invention will become apparent from the following description of the invention which refers to the accompanying drawings.

DETAILED DESCRIPTION OF EMBODIMENTS OF THE INVENTION

Figure 1:
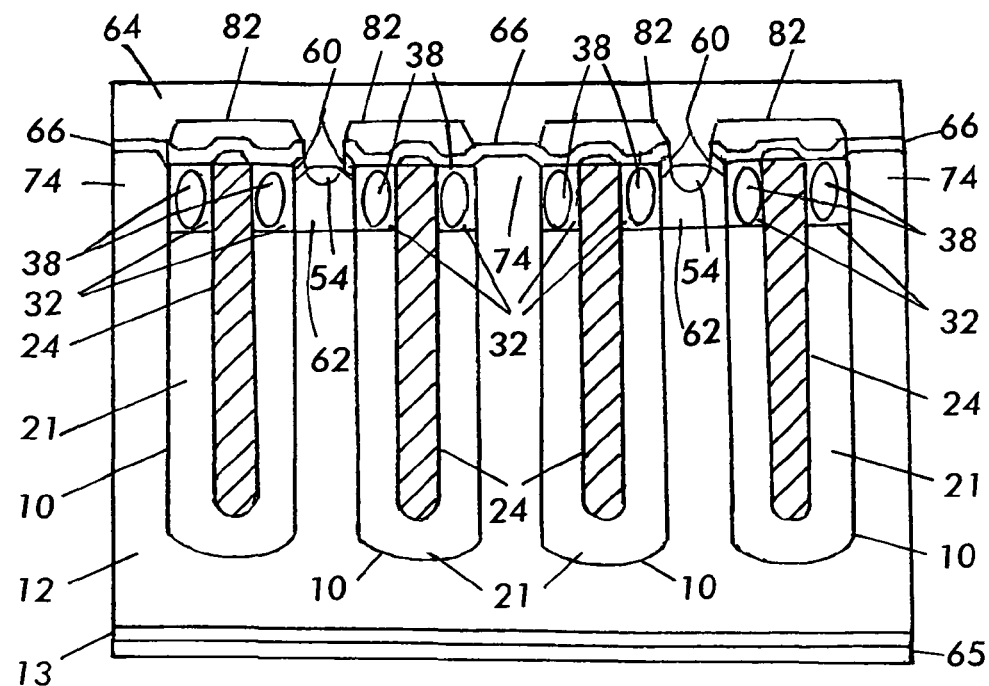
FIG. 1 illustrates a cross-sectional view of a device according to a first embodiment of the present invention.

Referring to FIG. 1, a semiconductor device according to a first embodiment of the present invention is preferably a power MOSFET that includes a plurality of spaced deep source trenches 10 formed in a semiconductor body 12, which can be an epitaxially grown silicon body of one conductivity (e.g. N type) disposed over a silicon substrate 13 of the same conductivity. Each trench 10 includes a thick oxide body 21 disposed in the interior and lining at least the bottom and a portion of the sidewalls thereof. A device according to the present invention further includes base regions 62 of the opposite conductivity to body 12 (e.g. P type), source regions 60 of the same conductivity as body 12 formed in base regions 62, a plurality of insulated gate electrodes 38 each insulated from a respective base region 62 by a gate oxide body 32, which is thinner than thick oxide body 21, disposed in trenches 10, a plurality of deep source electrodes 24 which are insulated from, but extend through respective pairs of gate electrodes 38, and a drain contact 65 coupled to substrate 13. Deep source electrodes 24 are ohmically coupled to a source contact 64, which is also ohmically coupled to source regions 60, and to channel regions 62 through a high conductivity contact region 54 of the same conductivity as base regions 62. Each trench 10 is spaced from at least two trenches by a respective Schottky mesa.

According to the present invention at least one or more of the mesas 74 do not include base and source regions, but serve as Schottky regions. Thus, in the preferred embodiment, at least one of the mesas adjacent two respective trenches 10 includes at a top thereof a Schottky barrier metal body 66, which makes Schottky contact with source contact 64, whereby a device is obtained that includes MOSFET regions (regions that include channel region 62 and source regions 60) and Schottky diode regions integrated in a single die. Note that, although the use of Schottky barrier metal is preferred, it may be possible to obtain an integrated Schottky diode by the proper selection of the conductivity of body 12, when, for example, aluminum is used to form source contact 64.

Note that the gate electrodes 38 adjacent mesa 74 may be connected to gate electrodes 38 of the MOSFET (electrodes 38 adjacent channel regions 62) or to source contact 64 and source field electrodes 24. If connected to source, it must be isolated from the MOSFET gate electrodes.

It should be noted that although FIG. 1 shows a device that includes alternately arranged MOSFET and Schottky regions, a device according to the present invention may include a number of MOSFET blocks each MOSFET block including a plurality of MOSFET regions, the MOSFET blocks being spaced occasionally by a Schottky block that includes a plurality of adjacent Schottky mesas 74 without deviating from the scope and the spirit of the present invention.

Figure 2:
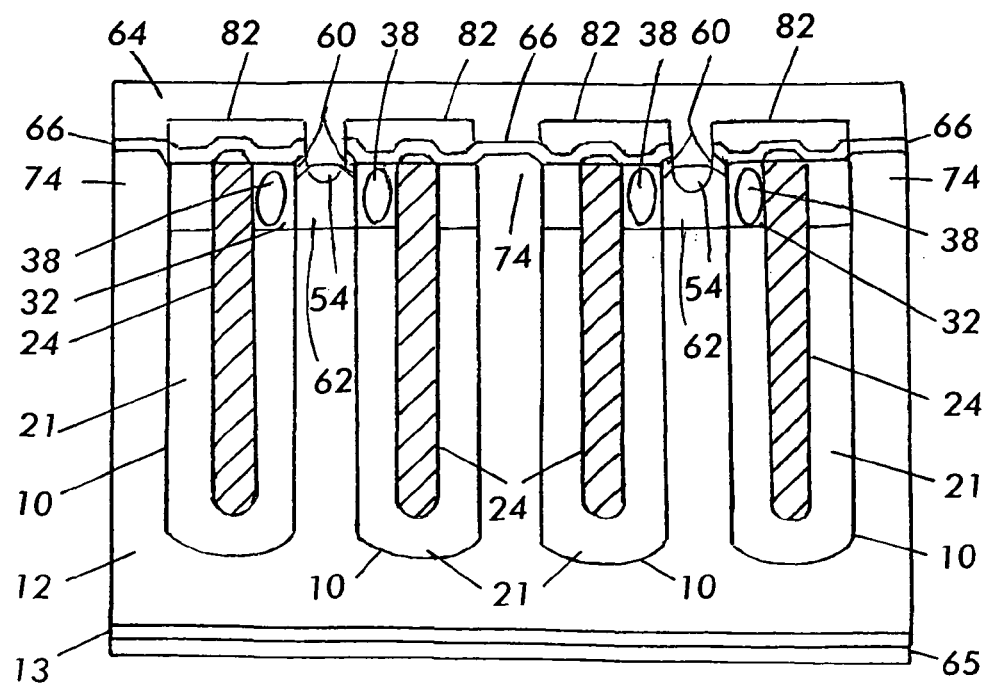
FIG. 2 illustrates a cross-sectional view of a device according to a second embodiment of the present invention.

Referring now to FIG. 2, in which like numerals identify like features, a device according to the second embodiment of the present invention may include same features as those of the first embodiment, except that no gate electrodes 38 are provided adjacent mesas in the Schottky regions 74 of the device.

A device according to the second embodiment may be useful in cases involving high electric field across the gate oxide.

Figure 3A:
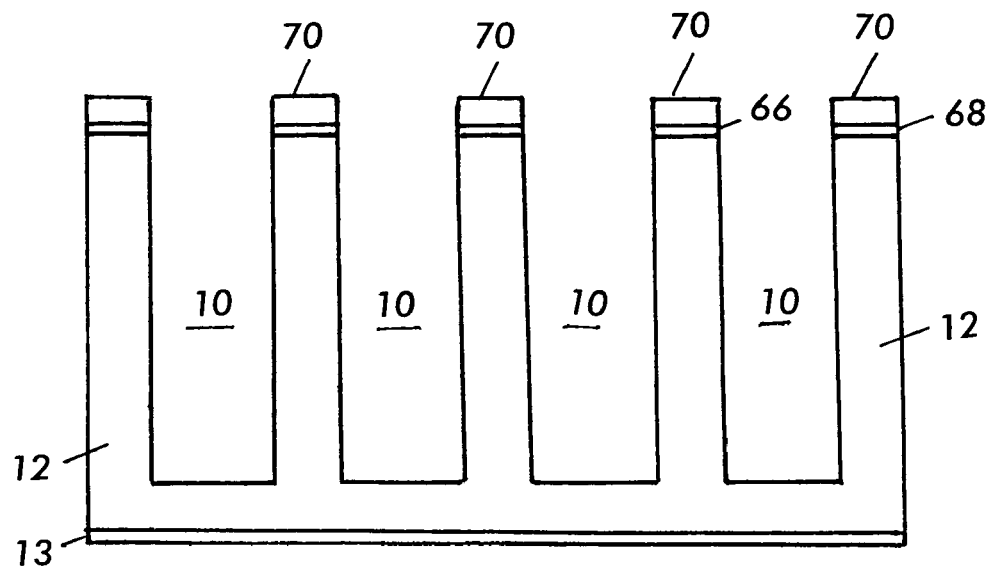
FIGS. 3A-3F illustrate steps in a method for fabrication of a device according to the present invention.

Referring now to FIG. 3A, to fabricate a device according to the present invention, pad oxide 68 is grown over a surface of semiconductor body 12, a nitride hard mask 70 is deposited over pad oxide 68, and a plurality of source trenches 10 are formed in semiconductor body 12 by etching pad oxide 68 and silicon from the bottom of openings in mask 70.

Figure 3B:
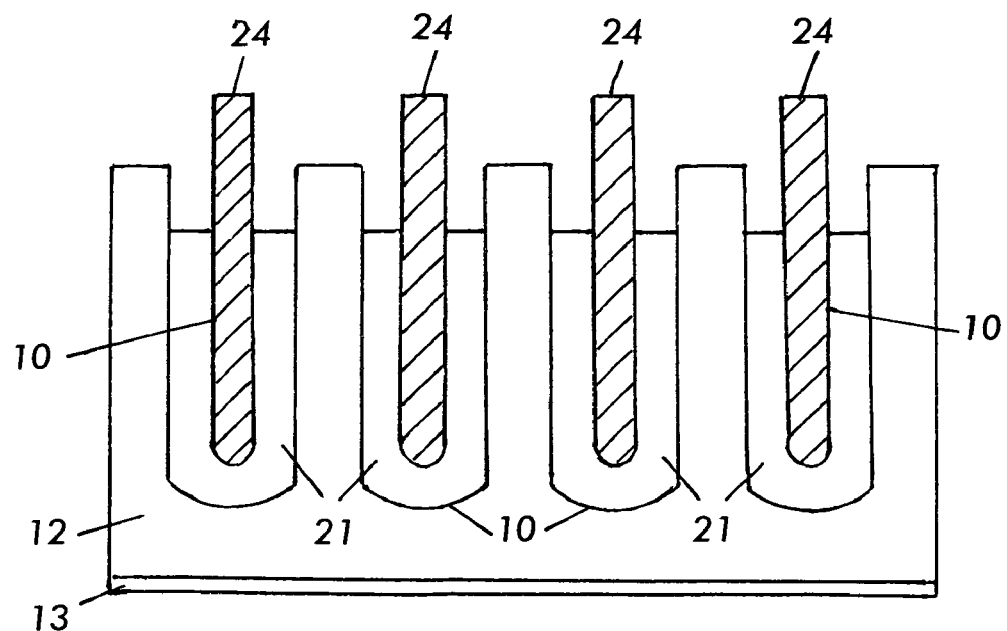

Referring next to FIG. 3B, thick oxide 21 is grown inside trenches 10 using any desired method. For example, a method as set forth in U.S. application Ser. No. 11/890,849 can be used to form thick oxide 21. The same method can be used to obtain source field electrode 24 as illustrated by FIG. 3B. Namely, field electrodes that extend above the top surface of thick oxide bodies 21.

Figure 3C:
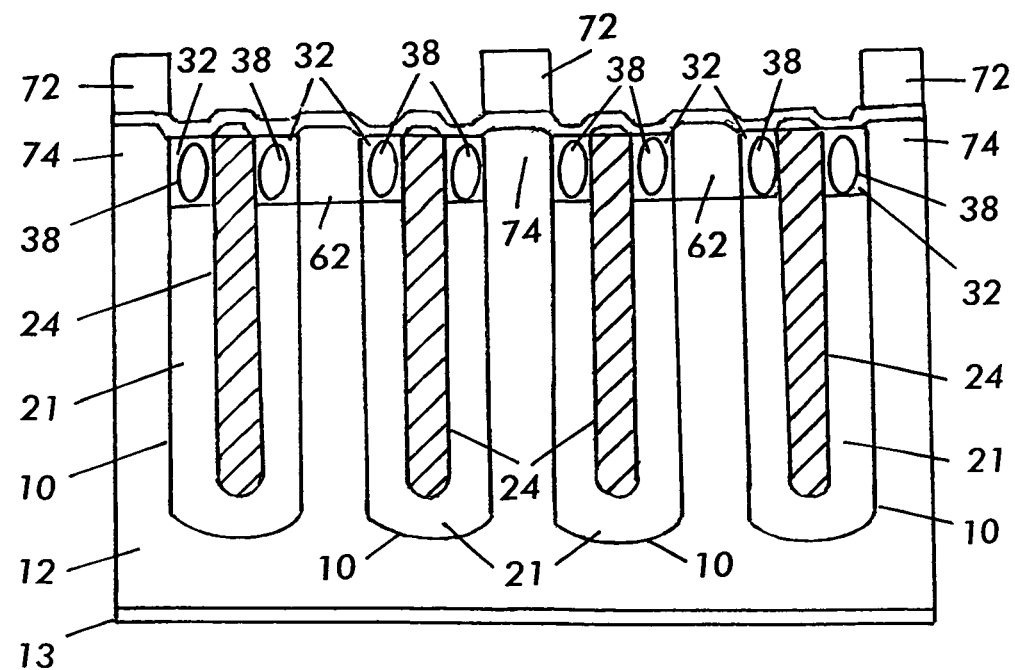

Referring next to FIG. 3C, gate oxide 32 is grown on the exposed surfaces of the mesas between trenches 10 in an oxidation process which also oxidizes the exposed surfaces of source field electrodes 24. Thereafter, polysilicon is deposited, rendered conductive, and etched back to obtain gate electrodes 38.

Next, through another oxidation step, the exposed surfaces of gate electrodes 36 are oxidized. Then, according to an aspect of the present invention a mask 72 is applied to cover mesas 74 that are to serve as Schottky regions of the device, and dopants for forming channel implants are implanted and driven in a diffusion drive to obtain base regions 62.

Figure 3D:
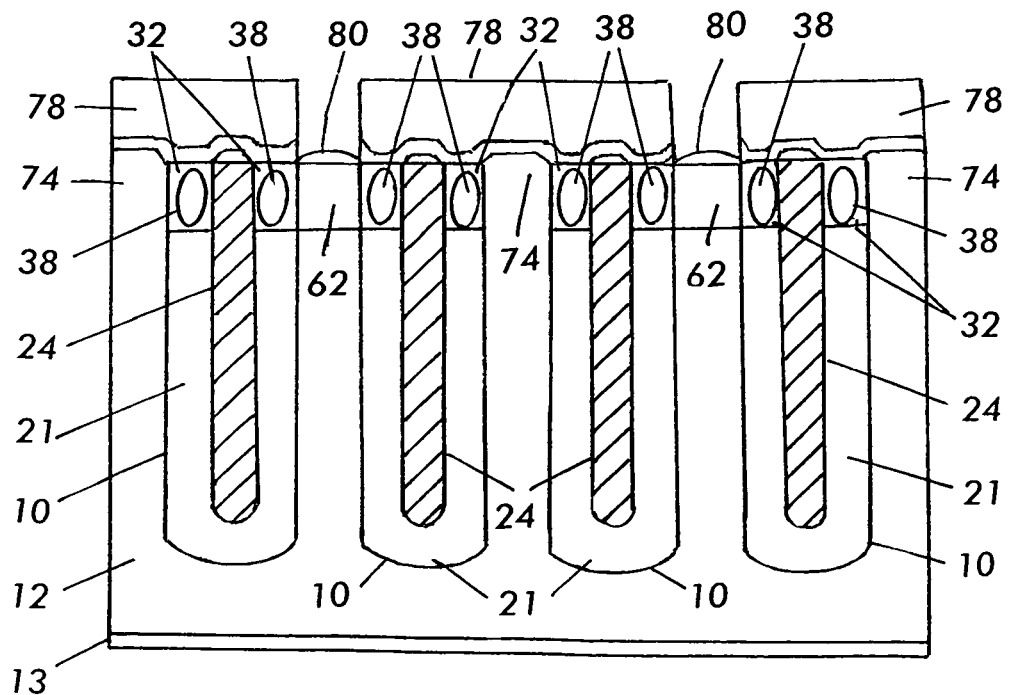

Referring next to FIG. 3D, the channel implant mask is removed, and then a source implant mask 78 is formed covering over mesas 74. Note that oxide on the mesa regions is removed prior to application of mask 78. Dopants for forming source regions 60 are implanted through the openings in mask 78 to obtain source implant regions 80.

Figure 3E:
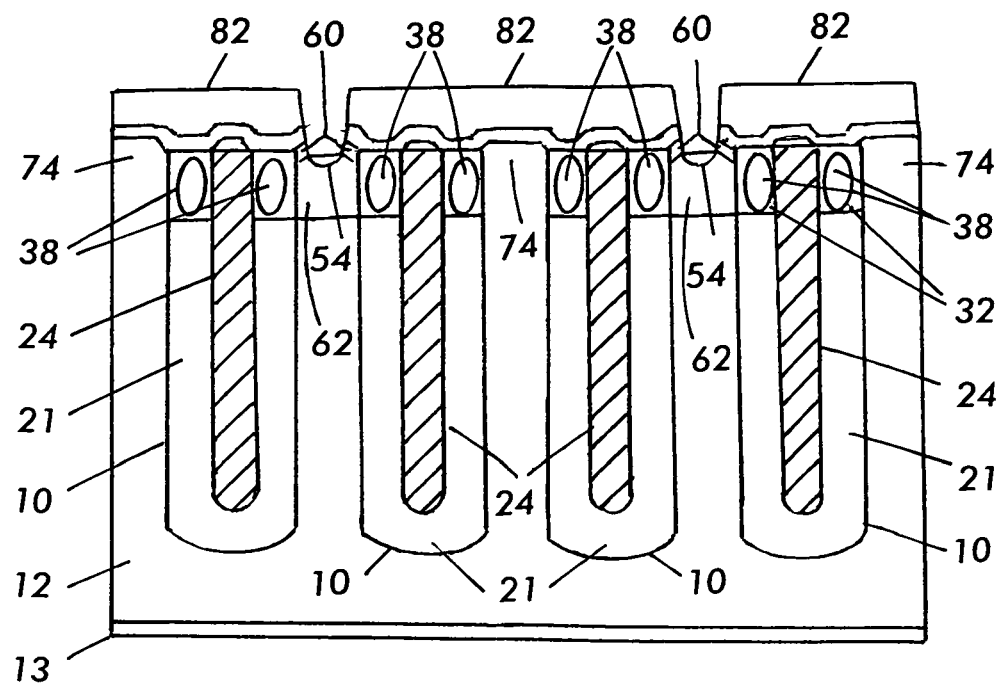

Referring next to FIG. 3E, mask 78 is removed followed by the deposition of TEOS or the like oxide which is then patterned to obtain oxide interlayer bodies 82 over the gate electrodes 38 and source field electrodes 24 in each trench 10 as well as Schottky regions 74. Thereafter, silicon is removed from the bottom of the spaces between oxide interlayers 82 through source implant regions 80. Thereafter, source implant regions 80 are driven to form source regions 60 followed by implants for forming high conductivity contact regions 54, which is itself followed by an anneal or RTA to obtain regions 54.

Figure 3F:
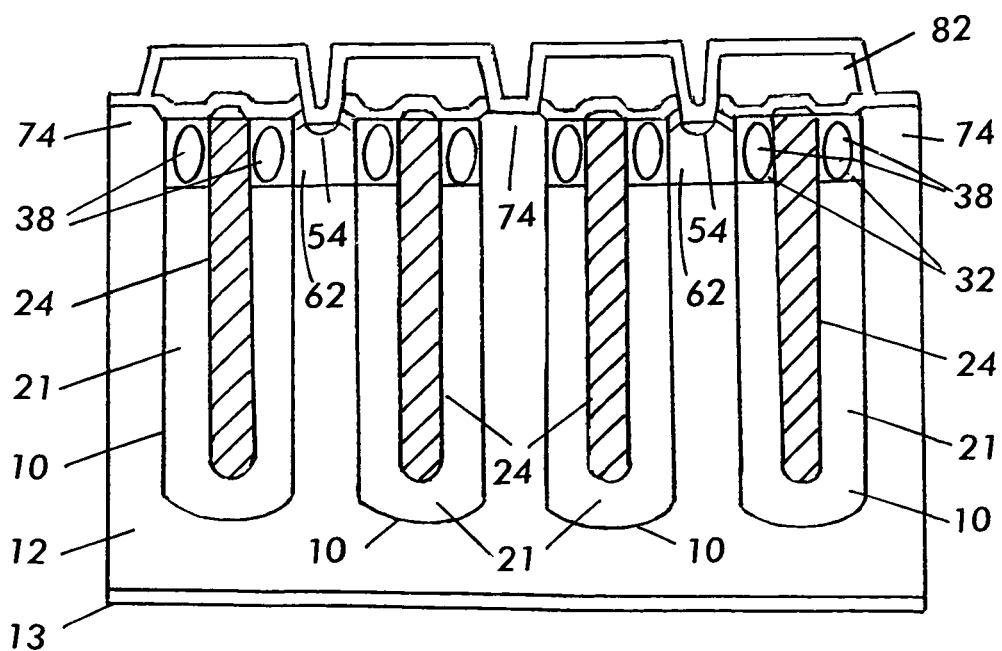

Referring to FIG. 3F, a mask 84 is applied over to remove TEOS from the top of mesas 74. Mask 84 is then removed and a barrier metal layer (e.g. molybdenum) is then deposited over oxide interlayers 82, mesas 74, high conductivity contact regions 54, and source regions 60.

Heat is then applied whereby barrier layer 86 over regions 54, and regions 60 forms a silicide layer to improve the ohmic contact between regions 54, source regions 60 and source contact 64. In addition, barrier layer 86 forms a Schottky contact with mesas 74. After the application of heat, excess material from barrier layer 86 overlying interlayers 82 is removed to obtain barrier bodies 66.

Alternatively, a Schottky barrier metal layer 86 (e.g. molybdenum) is deposited over mask 84 and exposed portions of mesa 74, and the excess portions of barrier layer 86 is then removed to obtain barrier bodies 66 over mesas 74. After formation of barrier bodies 66, source contact 64 is applied followed by application of drain contact 65 through sputtering or the like to obtain a device as illustrated, for example, in FIG. 1.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
a semiconductor body of one conductivity;
a first source trench extending into said semiconductor body, and a second source trench extending into said semiconductor body, each said source trench including one sidewall adjacent a base region of another conductivity in said semiconductor body and another opposing sidewall adjacent a schottky region, and each said source trench further including a gate electrode spanning said base region, a gate oxide body, and a deep source field electrode that extends past said gate electrode to a depth below said gate electrode disposed within said source trench, said gate oxide body formed between said one sidewall and a side of said gate electrode facing said one sidewall, and said gate oxide body formed between said deep source field electrode and an opposite side of said gate electrode facing said deep source field electrode.

2. The power semiconductor device of claim 1, wherein each said source trench further includes another gate electrode spanning a portion of said schottky region and another gate oxide body, and wherein said deep source field electrode extends past said another gate electrode to a depth below said another gate electrode.

3. The power semiconductor device of claim 2, further comprising a source contact coupled to said deep source field electrodes and said another gate electrode.

4. The power semiconductor device of claim 1, wherein said schottky region comprises a mesa of only said one conductivity and includes a schottky barrier body formed at a top portion thereof.

5. The power semiconductor device of claim 1, wherein said schottky region comprises a mesa of only said one conductivity that makes schottky contact with a source contact of said device.

6. The power semiconductor device of claim 1, wherein each said deep source field electrode resides in a thick insulation body that is thicker than said gate oxide body therein residing below said gate electrode.

7. The power semiconductor device of claim 6, wherein said thick insulation body extends along said another sidewall in each said source trench to the top of said semiconductor body.

8. The power semiconductor device of claim 1, wherein said Schottky region includes one mesa.

9. The power semiconductor device of claim 1, wherein said Schottky region includes a plurality of adjacent Schottky mesas.

10. A power semiconductor device comprising:
a semiconductor body of one conductivity;
a plurality of source trenches extending into said semiconductor body, each said source trench including a gate electrode, a gate oxide body, and a deep source field electrode that extends past said gate electrode to a depth below said gate electrode disposed within said source trench, each said source trench further including one sidewall adjacent a first mesa in said semiconductor body and another opposing sidewall adjacent a second mesa in said semiconductor body;
said first mesa comprising a base region of another conductivity and said second mesa comprising a schottky mesa, each said source trench being spaced from an adjacent said source trench by said schottky mesa;
said gate oxide body in each said source trench being on respective facing sides of said deep source field electrode and said gate electrode.

11. The power semiconductor device of claim 10, wherein each said source trench is spaced from at least two said source trenches by a respective schottky mesa.

12. The power semiconductor device of claim 10, wherein said gate oxide body is also on a side of said gate electrode that faces said base region.

13. The power semiconductor device of claim 10, wherein said plurality of source trenches each further include a thick oxide body disposed within and lining at least a bottom and a portion of the sidewalls thereof, said gate electrode disposed over said thick oxide body.

14. The power semiconductor device of claim 10, wherein each said source trench further includes another gate electrode and another gate oxide body, and wherein said deep source field electrode is insulated from, but extending through said gate electrodes.

15. The power semiconductor device of claim 14, further comprising a source contact coupled to said deep source field electrode and said another gate electrode.

16. A power semiconductor device comprising:
a semiconductor body of one conductivity;
a source trench extending into said semiconductor body including one sidewall adjacent a base region of another conductivity in said semiconductor body and another opposing sidewall adjacent a schottky region;
said source trench further including a gate electrode spanning said base region, a gate oxide body, and a deep source field electrode that extends past said gate electrode to a depth below said gate electrode disposed within said source trench, said gate oxide body on respective facing sides of said deep source field electrode and said gate electrode.

17. The power semiconductor device of claim 16, comprising:
a source contact coupled to said deep source field electrode;
a schottky barrier metal body over said source trench and said schottky region, said schottky barrier metal body making schottky contact with said source contact.

18. The power semiconductor device of claim 16, wherein said source trench further includes a thick oxide body disposed within and lining at least a bottom and a portion of the sidewalls thereof, said gate electrode disposed over said thick oxide body.

19. The power semiconductor device of claim 16, wherein said source trench further includes another gate electrode and another gate oxide body, and wherein said deep source field electrode is insulated from, but extends through said gate electrode and said another gate electrode.

20. The power semiconductor device of claim 19, further comprising a source contact coupled to said deep source field electrode and said another gate electrode.

* * * * *